United States Patent [19]

Nakajima et al.

[11] Patent Number: 5,674,410
[45] Date of Patent: Oct. 7, 1997

[54] CHEMICAL AGENT PRODUCING DEVICE AND METHOD THEREOF

[75] Inventors: Kazuo Nakajima; Katsunori Tanaka, both of Shiga-ken, Japan

[73] Assignee: Dainippon Screen Manufacturing Co., Ltd., Japan

[21] Appl. No.: 271,081

[22] Filed: Jul. 6, 1994

[30] Foreign Application Priority Data

Jul. 20, 1993 [JP] Japan .................. 5-200959

[51] Int. Cl.$^6$ .................. H01L 21/306; H01L 21/304
[52] U.S. Cl. .................. 216/92; 216/85; 216/93; 156/345; 156/627.1; 156/642.1; 134/1.3
[58] Field of Search .................. 216/93, 91, 92, 216/90, 84, 85; 156/640.1, 627.1, 626.1, 642.1, 637.1, 345; 134/1.3, 10

[56] References Cited

U.S. PATENT DOCUMENTS

| | | | |
|---|---|---|---|
| 3,306,792 | 2/1967 | Thürmel et al. | 156/345 |
| 3,526,560 | 9/1970 | Thomas | 156/345 |
| 3,999,564 | 12/1976 | Pesek | 134/111 |
| 4,190,481 | 2/1980 | Goffredo | 156/345 |
| 4,388,276 | 6/1983 | Konstatouros et al. | 422/187 |
| 4,576,677 | 3/1986 | Faul et al. | 156/642 |
| 4,838,979 | 6/1989 | Nishida et al. | 156/345 |
| 4,971,654 | 11/1990 | Scknegg et al. | 156/638 |
| 5,082,518 | 1/1992 | Molinaro | 156/345 |
| 5,191,908 | 3/1993 | Hiroe et al. | 134/76 |
| 5,227,010 | 7/1993 | Lufert et al. | 156/642 |
| 5,282,923 | 2/1994 | Cannizzaro | 156/642.1 |
| 5,415,191 | 5/1995 | Mashimo et al. | 134/102.1 |
| 5,470,421 | 11/1995 | Nakada et al. | 156/642.1 |

FOREIGN PATENT DOCUMENTS

| | | |
|---|---|---|
| 2205025 | 8/1990 | Japan . |
| 04162723 | 6/1992 | Japan . |
| 0541369 | 2/1993 | Japan . |

Primary Examiner—R. Bruce Breneman
Assistant Examiner—George Goudreau
Attorney, Agent, or Firm—Ostrolenk, Faber, Gerb & Soffen, LLP

[57] ABSTRACT

The purity of a liquid chemical agent is improved simultaneously with obtaining a homogeneous concentration of a specific chemical in the agent, thereby improving the quality of substrate processing steps. Pure water is supplied from a pure water supply (30) into a process tank (1) by opening an opening/closing valve (33) on a pure water supply system (7) and by closing an opening/closing valve (19) on a circulation system (5). After the process tank (1) is completely charged with pure water, the opening/closing valve (33) is closed while the opening/closing valve (19) is opened. This closes a pipe conduit (11) of the circulation system (5) and allows pure water in the process tank (1) to be circulated through the circulation system (5) by a pump (13). A first opening/closing valve (49) on a gas supply system (9) is subsequently opened to allow hydrogen chloride gas from a hydrogen chloride gas supply (40) to be fed into a mixing unit (17) of the circulation system (5). This results in mixing of the hydrogen chloride gas with pure water in the mixing unit (17) to make a liquid chemical agent.

17 Claims, 9 Drawing Sheets

CHEMICAL AGENT PRODUCING DEVICE AND METHOD THEREOF

BACKGROUND OF THE INVENTION

1. Field of the Invention

The present invention relates to a device for producing a chemical agent and more specifically to a chemical agent producing device for supplying a chemical agent for use in the processing of substrates for semi-conductor devices, such as semi-conductor wafers and glass substrates of liquid crystal panels.

2. Description of Related Art

A substrate cleaning apparatus is one of many substrate processing apparatuses that are used for executing a variety of treatments on substrates, such as semi-conductor wafers. The substrate cleaning apparatus includes a process tank for storing a liquid chemical agent such as hydrochloric acid or ammonia water. The substrates are soaked in the liquid chemical agent in the process tank so as to be cleaned with the liquid chemical agent. The substrate cleaning apparatus generally includes a plurality of reservoir tanks for individually storing different chemical agents and any required chemical agent is fed from the corresponding reservoir tank to the process tank.

In such a conventional apparatus, the liquid chemical agent is transported, stored, and transferred before being stored in the reservoir tank. The liquid chemical agent often includes fine particles and, in many cases, is contaminated with a metal and, therefore, has insufficient purity. The purity of the liquid chemical agent is especially important in a substrate cleaning apparatus since semi-conductor wafer substrates are directly soaked in the liquid chemical agent. The low purity of the liquid chemical agent causes fine particles or metal pollutants that are included in the liquid chemical agent to adhere to the surface of substrates in the process of cleaning the substrates. This lowers the quality of substrate cleaning.

In the prior art, the liquid chemical agent is generally passed through a filter to remove the fine particles that are included in the liquid chemical agent. This treatment, however, does not effectively remove the very fine particles of recently developed fine elements so that a sufficiently pure liquid chemical agent is not obtained.

A cleaning apparatus for spraying a gas such as hydrogen chloride and a pure water mist onto substrates has been proposed for improving the purity of the liquid chemical agent. See, JAPANESE PATENT LAYING-OPEN GAZETTE No. 62-213127. This cleaning apparatus synthesizes a liquid chemical agent by mixing the gas with pure water mist. Such a system allows the gas to be purified through a filter and heightens the purity of the liquid chemical agent compared with the direct purification of the liquid chemical agent with the filter. It is, however, rather difficult to obtain a homogeneous concentration of a specific chemical in the liquid chemical agent synthesized by mixing the gas and the pure water mist with each other. The heterogeneous concentration that is obtained results in a non-uniform treatment of the substrates, i.e., cleaning of the substrates in this case.

SUMMARY OF THE INVENTION

Accordingly, it is an object of the present invention to improve the purity of a liquid chemical agent while simultaneously obtaining a homogeneous concentration of a specific chemical in the agent, thereby improving the quality of substrate treatment including the cleaning and etching of the substrates.

The present invention is directed to a device for producing a liquid chemical agent used for treating a substrate for a semi-conductor device. In one embodiment of the present invention, the device includes a container adapted to treat the substrate with the liquid chemical agent, the container having an inlet and an outlet; circulation means connecting the inlet and the outlet of the container, and having a circulation pump; a liquid reservoir; a gas supply; and a gas-liquid mixer for synthesizing the liquid chemical agent connected to the liquid reservoir and gas supply, and having an outlet for the liquid chemical agent connected to the circulation means.

In a preferred embodiment, the device further includes a filter disposed in the connection of the mixer with the gas supply.

Preferably, the device includes chemical concentration detection means disposed in the circulation means; and means for regulating the mixing ratio of the gas to the liquid connected to the Chemical concentration detection means and the mixer.

The chemical concentration detection means may be a sensor for detecting a pH of the liquid chemical agent.

Alternatively, the chemical concentration detection means includes a light source arranged to emit a light beam through the liquid chemical agent; means for detecting the intensity of the light beam passing through the liquid chemical agent; and means for correlating the intensity of the light beam detected with the concentration of a specific chemical in the liquid chemical agent.

According to another aspect of the present invention, the mixer further includes a plurality of packing members disposed therein for dispersing the gas in the liquid.

According to still another aspect of the present invention, the mixer further includes a hollow drum having an inlet and an outlet for the gas; and a jet nozzle disposed in the drum and comprising a conduit having a plurality of apertures for spraying the liquid into the drum; and the outlet for the liquid chemical agent being disposed on a lower part of the drum.

In a preferred embodiment, the container includes a tank, and the circulation means further includes an overflow tank surrounding the tank for receiving the liquid chemical agent that overflows from the tank; and a conduit connecting the overflow tank to the tank.

In another embodiment of the present invention a device for producing a liquid chemical agent used for treating a substrate for a semi-conductor device includes a container adapted to treat the substrate with the liquid chemical agent, the container having an inlet and an outlet; an auxiliary tank for storing the liquid chemical agent, the auxiliary tank having an inlet and an outlet, and connected to the container for feeding the liquid chemical agent to the container; circulation means connecting the inlet and the outlet of the auxiliary tank, and having a circulation pump; a liquid reservoir; a gas supply; and a gas-liquid mixer for synthesizing the liquid chemical agent connected to the liquid reservoir and gas supply, and having an outlet for the liquid chemical agent connected to the circulation means.

In a preferred embodiment, the container includes a tank; an overflow tank surrounding the tank for receiving the liquid chemical agent that overflows from the tank; and a conduit for discharging the liquid chemical agent received by the overflow tank.

Alternatively, the container includes a rotatable substrate holder; and means for spraying the liquid chemical agent fed from the auxiliary tank onto the substrate.

The present invention is also directed to a method of processing a liquid chemical agent for use in a unit adapted for treating a substrate for a semi-conductor device. The method includes: (a) supplying a liquid to a circulation system; (b) mixing a gas with the liquid to synthesize the liquid chemical agent; and (c) supplying the liquid chemical agent to the unit for treating a substrate for a semi-conductor device.

In a preferred embodiment, the method includes the step of removing fine particles included in the gas before step (b).

The method also includes: (d) detecting the concentration of a specific chemical in the liquid chemical agent; and (e) adjusting the mixing ratio of the gas to the liquid in step (b) based on the concentration detected in step (d) to control the concentration of the specific chemical in the liquid chemical agent to a desired value.

Preferably, step (b) includes the step of (b-1) dispersing the gas in the liquid.

Alternatively, step (b) further includes the steps of (b-2) storing the gas in a tank; (b-3) spraying the liquid from a plurality of apertures formed in a conduit of a nozzle into the tank; and (b-4) conveying the liquid chemical agent synthesized in step (b-3) to the outside of the tank.

In another embodiment of the present invention a method of processing a liquid chemical agent for use in a unit for treating a substrate for a semi-conductor device, includes (a) supplying a liquid to a circulation conduit; (b) mixing a gas with the liquid to synthesize the liquid chemical agent; (c) storing the liquid chemical agent in a auxiliary tank; and (d) feeding the liquid chemical agent to the unit for treating a substrate for a semi-conductor device.

Other features and advantages of the present invention will become apparent from the following description of the invention which refers to the accompanying drawings.

DESCRIPTION OF PREFERRED
EMBODIMENTS OF THE INVENTION

Figure 1:
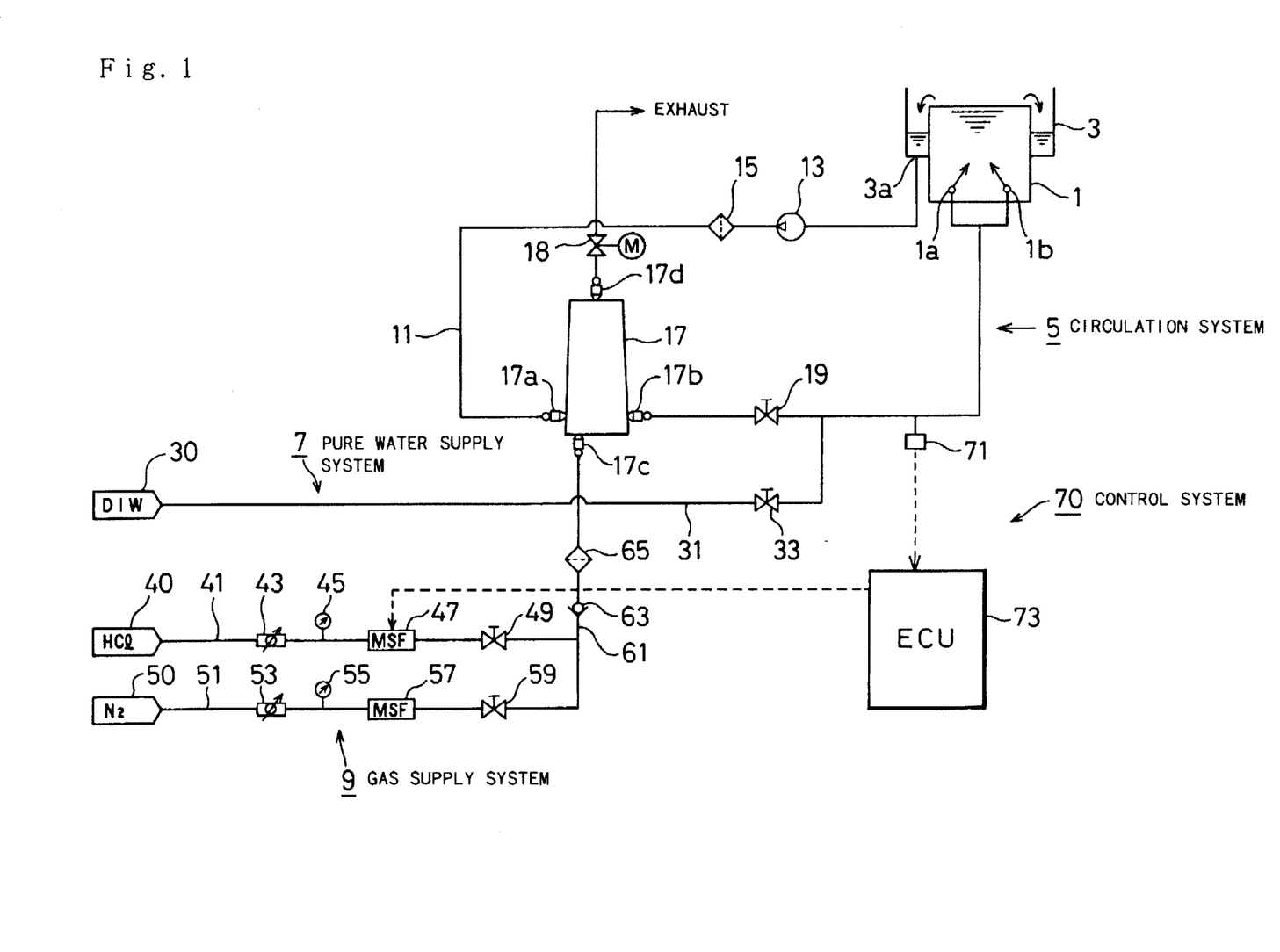
FIG. 1 schematically shows a first embodiment of a substrate cleaning apparatus having a chemical agent producing device according to the invention.

FIG. 1 schematically shows a first embodiment of a substrate cleaning apparatus having a chemical agent producing device according to the invention. As shown in FIG. 1, the substrate cleaning apparatus includes a process tank 1 made of, for example, quartz glass for storing a liquid chemical agent, an over-flow tank 3 surrounding the process tank 1 for receiving the liquid chemical agent that overflows from the process tank 1, a circulation system 5 for returning the liquid chemical agent that is received in the over-flow tank 3 to the process tank 1, a pure water supply system 7 for supplying pure water to the circulation system 5, and a gas supply system 9 for supplying, for example, hydrogen chloride gas (HCl) or nitrogen gas ($N_2$) to the circulation system 5.

The process tank 1 stores some semi-conductor substrates (not shown). The substrates may be semi-conductor wafers or glass substrates of liquid crystal.

The circulation system 5 includes a pipe conduit 11 running from an outlet 3a for the liquid chemical agent formed on a bottom wall of the over-flow tank 3 to a pair of up-flow tubes 1a and 1b disposed inside the process tank 1. A pump 13, a filter 15, a mixing unit 17, and an opening/closing valve 19 are disposed along the pipe conduit 11 in the direction from the outlet 3a to the up-flow tubes 1a and 1b. The up-flow tubes 1a and 1b are formed as pipes having a plurality of apertures in a longitudinal direction of the pipes. The up-flow tubes 1a and 1b provide jets of the liquid chemical agent circulating through the pipe conduit 11 into the process tank 1.

Figure 2:
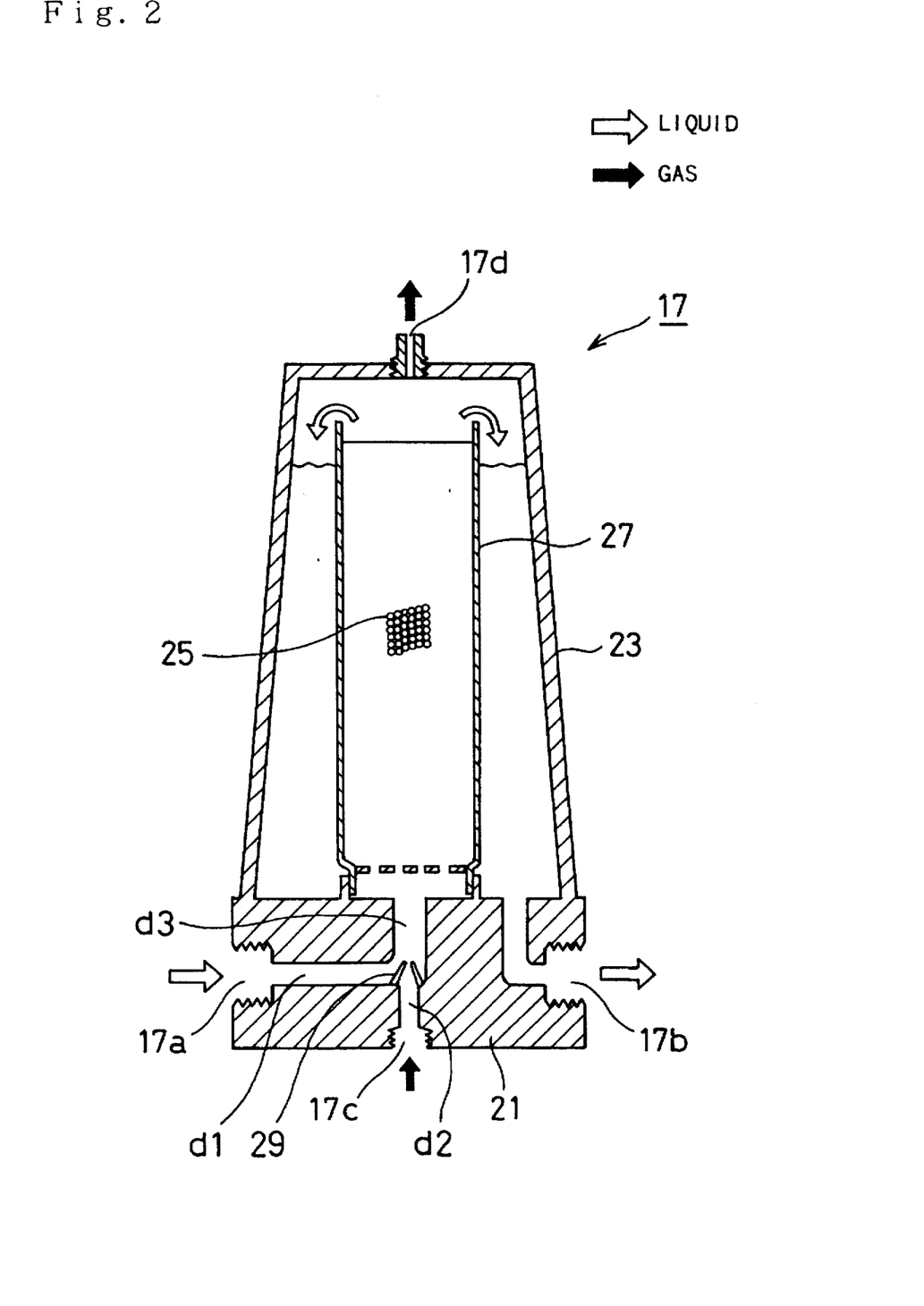
FIG. 2 schematically shows a mixing unit 17.

The mixing unit 17 for mixing a gas with a liquid flow has a structure as described below. As shown in FIG. 2, the mixing unit 17 includes a base 21, and a cap 23 formed on the base 21. A cylindrical packed tower 27, which is filled with a number of packing members 25, is placed inside the cap 23. The base 21 is provided with a liquid inlet 17a, a liquid outlet 17b, and a gas inlet 17c. A gas outlet 17d is also formed on a top face of the cap 23. A first flow path d1 that is connected to the liquid inlet 17a and a second flow path d2 that is connected to the gas inlet 17c cross at a position in the vicinity of a center of the base 21 and further connect to a third flow path d3 that is connected to the packed tower 27. An orifice 29 for throttling a flow in the second flow path d2 is formed at an intersection of the first flow path d1 and the second flow path d2.

Figure 3:
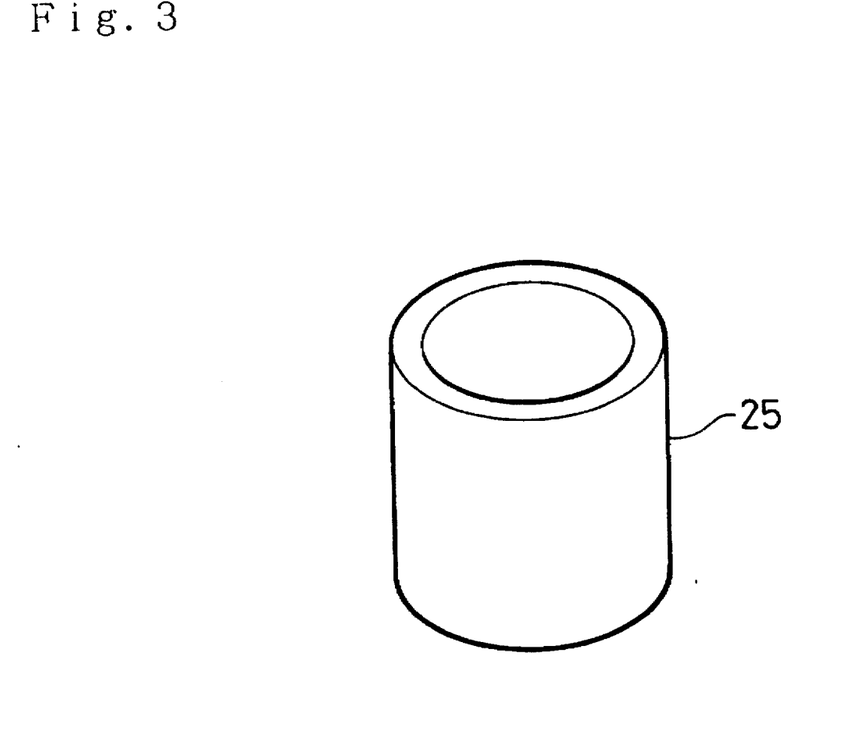
FIG. 3 is a perspective view illustrating an example of packing members 25 with which a packed tower 27 of the mixing unit 17 is charged.
Figure 4:
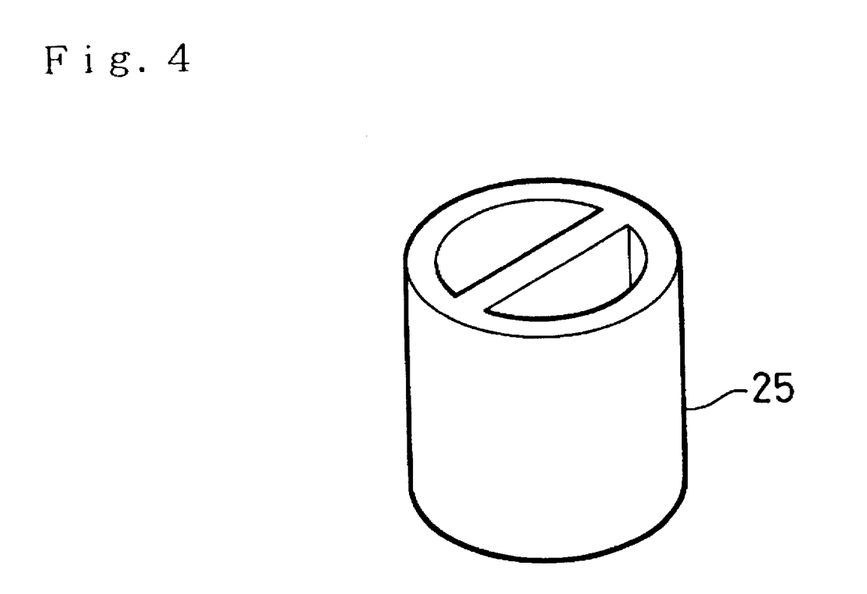
FIG. 4 is a perspective view showing another example of the packing members 25.

The packed tower 27 has a diameter of, for example, 100 through 150 mm and a height of approximately 350 mm. The packing members 25 in the packed tower 27 may be made of ceramics, synthetic resin, or stainless steel and have a height of, for example, 25 through 50 mm and a shape having a large surface area. The packing member 25 may be a cylinder called a raschig ring as shown in FIG. 3 or a cylinder with a vertical partition called a lessing ring as shown in FIG. 4.

In the mixing unit 17, a liquid that flows into the liquid inlet 17a runs through the first flow path d1 and the third flow path d3 and is led into the packed tower 27. A gas that flows into the gas inlet 17c runs through the second flow path d2 and the third flow path d3 via the orifice 29, and is led into the packed tower 27 while being mixed with the liquid. The liquid containing the gas diffuses in the packed tower 27, so that the gas and the liquid are mixed sufficiently with each other. The liquid mixed with the gas then flows over the packed tower 27 to drop outside the packed tower 27 and is fed out of the mixing unit 17 via the liquid outlet 17b. The liquid sufficiently mixed with the gas in the above manner makes a liquid chemical agent.

Referring again to FIG. 1, in the circulation system 5, the liquid inlet 17a is connected with the pipe conduit 11 on the side of the filter 15 whereas the liquid outlet 17b is connected with the pipe conduit 11 on the side of the opening/closing valve 19. The mixing unit 17 is placed at a specific position that is higher than the surface of the liquid in the process tank 1 so as to ensure a smooth flow of the liquid from the mixing unit 17 to the process tank 1. The gas outlet 17d has an electric motor operated valve 18 (see FIG. 1), which is generally in a closed position so as to prevent the feeding pressure of the gas from the liquid inlet 17a from leaking through the gas outlet 17d, and is in an open position to discharge the gas in the packed tower 27 when the gas in the packed tower 27 reaches a predetermined amount. The amount of the gas in the packed tower 27 is measured by detecting the height of the liquid surface with a liquid surface sensor (not shown) disposed in the packed tower 27.

The pure water supply system 7 includes a pure water supply 30 and a pipe conduit 31 connecting the pure water supply 30 to the pipe conduit 11 downstream of the opening/closing valve 19 of the circulation system 5. The pipe conduit 31 is provided with an opening/closing valve 33 along its route. The opening/closing valve 33 activates or stops the feeding of pure water into the circulation system 5.

The gas supply system 9 includes a first gas conduit 41 that is connected to a hydrogen chloride gas supply 40 and a second gas conduit 51 that is connected to a nitrogen gas supply 50. The first and the second gas conduits 41 and 51 meet each other and connect to the gas inlet 17c of the mixing unit 17. A first regulator 43 for controlling the flow pressure to a predetermined value, a first pressure gauge 45 for measuring the pressure, a first massflow controller (hereinafter referred to as MSF) 47 for controlling the flow rate according to external instructions, and a first opening/closing valve 49 are disposed along the first gas conduit 41 in the direction of the flow. The second gas conduit 51 is provided with a second regulator 53, a second pressure gauge 55, a second MSF 57, and a second opening/closing valve 59 in the same manner as the first gas conduit 41. A pipe conduit 61 where the first and the second gas conduits 41 and 51 meet each other has a check valve 63 and a filter 65, which are disposed along the pipe conduit 61 in the direction of the flow.

In the gas supply system 9, hydrogen chloride gas is supplied into the gas inlet 17c of the mixing unit 17 when the first opening/closing valve 49 on the first gas conduit 41 is opened and the second opening/closing valve 59 on the second gas conduit 51 is closed. The hydrogen chloride gas is subsequently mixed with pure water flowing through the circulation system 5 in the mixing unit 17 while excess gas is discharged from the gas outlet 17d. The second opening/closing valve 59 on the second gas conduit 51 is opened as required so as to mix nitrogen gas with the flow of hydrogen chloride gas. This results in dilution of the hydrogen chloride gas with nitrogen gas so as to control mixing conditions. Also, residual hydrogen chloride gas in the gas supply system 9 could cause corrosion of the elements of the gas supply system 9 including the pipes, valves, and joints. Therefore, the fluid in the gas supply system 9 including the pipe conduit 61 is replaced with nitrogen gas or an inert gas when the gas supply system 9 is not being used.

The substrate cleaning apparatus of the embodiment further includes a control system 70 for controlling the first MSF 47 and the other actuators. The control system 70 includes a chemical concentration sensor 71 disposed downstream from the opening/closing valve 19 of the pipe conduit 11, and an electronic control unit (hereinafter referred to as ECU) 73 for receiving detection signals from the chemical concentration sensor 71 and outputting control signals to the first MSF 47.

The chemical concentration sensor 71, for example, has a pH-measurement glass electrode placed in the pipe conduit 11 to detect the pH of the liquid circulating through the pipe conduit 11. The ECU 73 may be constituted as a logic operation circuit including a micro-computer. The ECU 73 drives and controls the first MSF 47 according to detection signals from the chemical concentration sensor 71 so as to control the concentration of hydrogen chloride in the liquid chemical agent.

Figure 5:
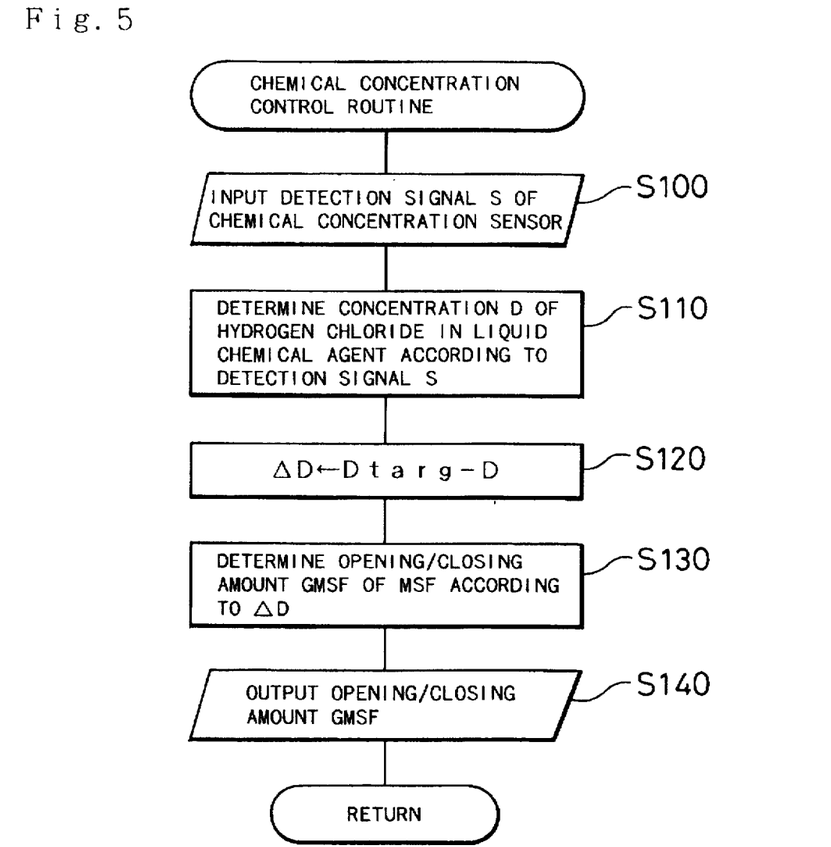
FIG. 5 is a flowchart showing a chemical concentration control routine executed by an electronic control unit 73.

A chemical concentration control routine executed by the ECU 73 is described according to the flowchart of FIG. 5. The chemical concentration control routine is repeated at predetermined time intervals.

Figure 6:
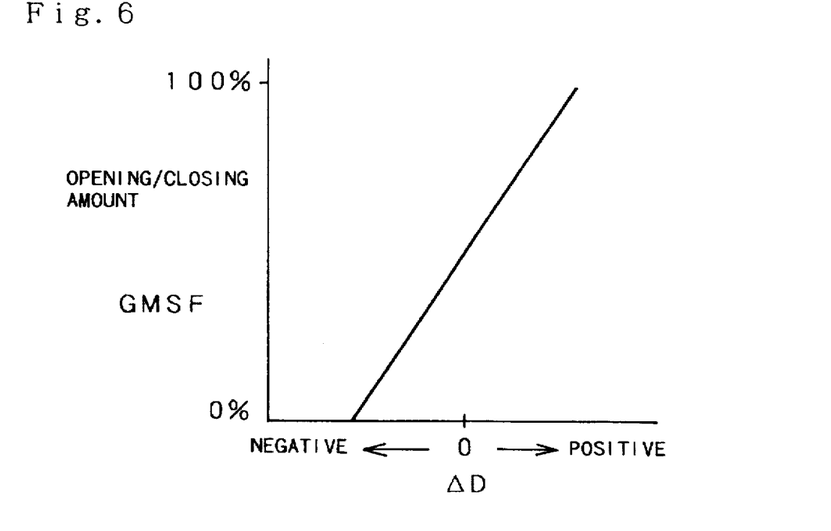
FIG. 6 is a graph showing the relationship between a deviation $\Delta D$ from a target chemical concentration and an opening/closing amount of a first massflow controller 47.

When the program enters the routine, the ECU 73 receives a detection signal S from the chemical concentration sensor 71 at step S100, and determines an actual concentration D of hydrogen chloride in the liquid chemical agent based on the detection signal S at step S110. The program then goes to step S120 at which the ECU 73 calculates a deviation ΔD of the actual concentration D determined at step S110 from a target concentration Dtarg of hydrogen chloride in the liquid chemical agent. The target concentration Dtarg is previously determined according to the type of the liquid chemical agent (hydrochloric acid in this embodiment). The program then proceeds to step S130 at which the ECU 73 determines an opening/closing amount GMSF of the first MSF 47 according to the deviation ΔD. The deviation ΔD is proportional to the opening/closing amount GMSF as shown by the graph of FIG. 6. More specifically, at step S130, the ECU 73 refers to a map representing such a proportional relationship, which is previously stored in a ROM of the ECU 73, and then determines the opening/closing amount GMSF according to the deviation ΔD.

After determination of the opening/closing amount GMSF at step S130, the program goes to step S140 at which the ECU 73 outputs a control signal corresponding to the opening/closing amount GMSF to the first MSF 47. The program then goes to 'RETURN' to exit from the routine.

The chemical concentration control routine described above makes the actual concentration D of the liquid chemical agent determined according to the detection signal S from the chemical concentration sensor 71 equal to the predetermined target concentration Dtarg. In the chemical concentration control routine of the embodiment, the concentration of the chemical agent is regulated by a P control (proportional action), but it may be regulated by a PID control (proportional plus integral plus derivative action).

Referring again to FIG. 1, the substrate cleaning apparatus works in the following manner. Under initial conditions, all the opening/closing valves 19, 33, 49, and 59 are in closed positions. The opening/closing valve 33 on the pure water supply system 7 is opened first to supply a flow of pure water through the pure water supply opening 30 into the process tank 1. The process tank 1 is then filled gradually with pure water. After the process tank 1 is completely charged with pure water, the whole pipe conduit 11 of the circulation system 5 is gradually filled with pure water. Then, while the opening/closing valve 33 is closed the opening/closing valve 19 on the circulation system 5 is opened, which results in opening of the pipe conduit 11 of the circulation system 5 and making pure water in the process tank 1 run through the circulation system by the operation of the pump 13.

The first opening/closing valve 49 on the gas supply system 9 is subsequently opened to allow hydrogen chloride gas from the hydrogen chloride gas supply 40 to be fed into the mixing unit 17 of the circulation system 5. This results in mixing of the hydrogen chloride gas with the pure water running through the circulation system 5 in the mixing unit 17 to make a liquid chemical agent. As the liquid chemical agent flows in the circulation system 5, supply of the hydrogen chloride gas from the gas supply system 9 gradually increases the concentration of hydrogen chloride in the liquid chemical agent. The concentration is maintained at a predetermined target concentration by the control system 70 as previously described above.

In this embodiment, the liquid chemical agent, that is, hydrochloric acid, stored in the process tank 1 is synthesized immediately before use. This significantly reduces the potential for pollution by the chemical agent or deterioration of the liquid chemical agent. The filter 65 disposed on the pipe conduit 61 effectively collects fine particles that are included in hydrogen chloride gas. This structure reduces the number of fine particles in the hydrochloric acid synthesized in the above manner, compared with a conventional system which directly filters the liquid chemical agent. The efficiency of collection of fine particles is generally greater for a gas than for a liquid. The purity of the liquid chemical agent can accordingly be heightened to the level of the pure water supplied from the pure water supply system 7. Therefore, the hydrochloric acid stored in the process tank 1 is sufficiently pure and enhances the quality of substrate cleaning with the hydrochloric acid.

The control system regulates the rate of hydrogen chloride gas that is mixed with the pure water circulating through the circulation system to thereby control the concentration of hydrogen chloride in the liquid chemical agent. This process substantially keeps the concentration of hydrochloric acid at a constant level, and allows the uniform and high-quality cleaning of the substrates. The process of adding the gas into the circulated pure water does not cause an abrupt exothermic reaction, but applies heat for a gradual rise in the temperature of the processing liquid, thus effectively saving energy for the heating of the processing liquid.

A second embodiment according to the invention is described below.

Figure 7:
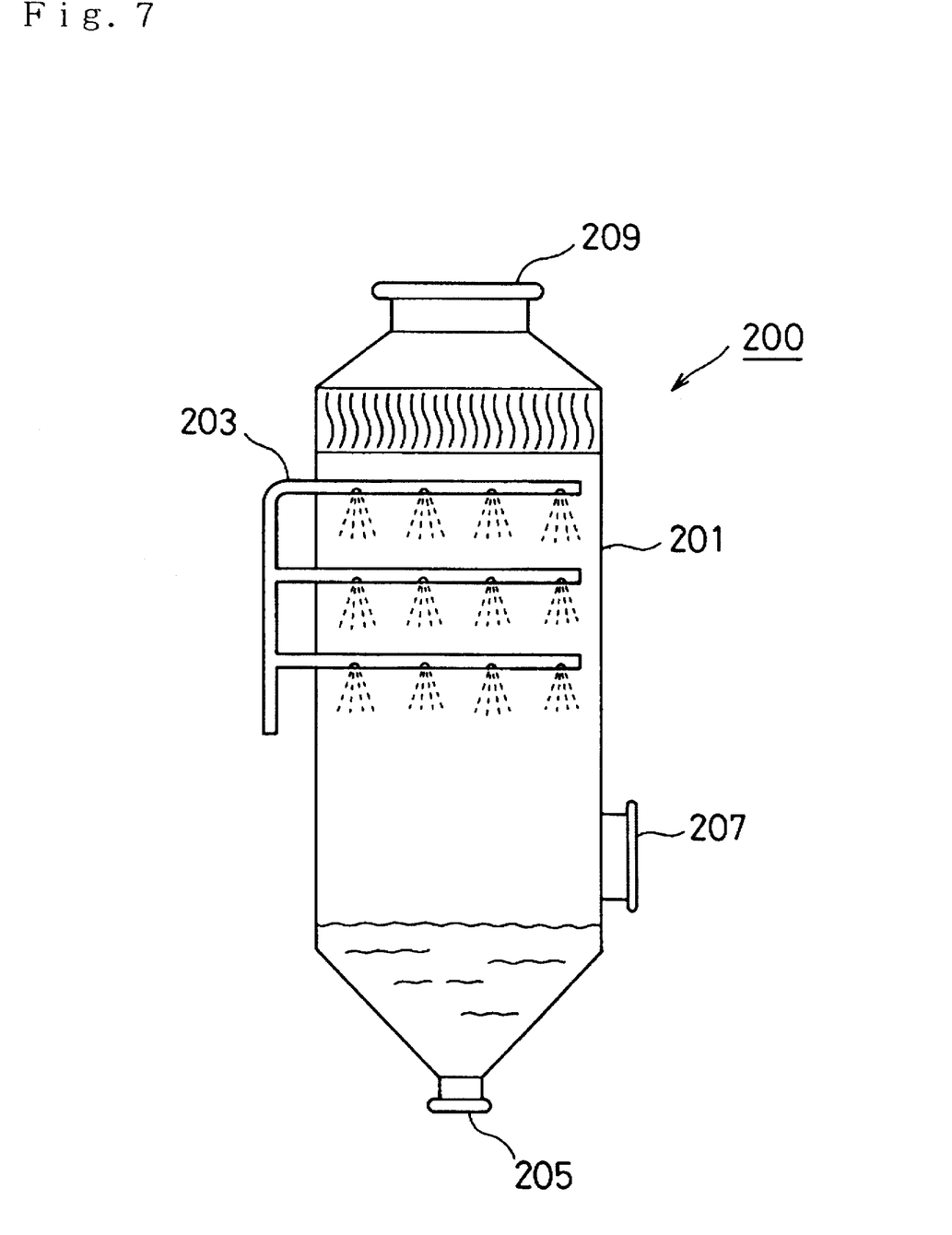
FIG. 7 schematically shows a second embodiment of a mixing unit 200.

A substrate cleaning apparatus having a chemical agent producing device of the second embodiment has a structure identical with that of the first embodiment except for the mixing unit. FIG. 7 schematically shows a structure of a mixing unit 200 used in the second embodiment.

Referring to FIG. 7, the mixing unit 200 includes a jet nozzle 203 having a plurality of apertures disposed inside a cylindrical casing 201. A liquid sprayed from the jet nozzle 203 is collected in a lower portion of the casing 201 and discharged from a liquid outlet 205. The casing 201 is further provided with a gas inlet 207 on a lower side face thereof and a gas outlet 209 on a top face thereof.

In the mixing unit 200, a gas (hydrogen chloride gas in this embodiment) flowing in through the gas inlet 207 moves upward to be discharged through the gas outlet 209 while a liquid (pure water in this embodiment) is sprayed from the jet nozzle 203 onto the gas. This process sufficiently mixes the gas with the liquid to synthesize a liquid chemical agent.

As in the first embodiment, the structure of the second embodiment heightens the purity of the liquid chemical agent and keeps the concentration of hydrogen chloride in the liquid chemical agent at a substantially constant level, thus allowing high-quality cleaning of the substrates.

A third embodiment according to the invention is described below.

Figure 8:
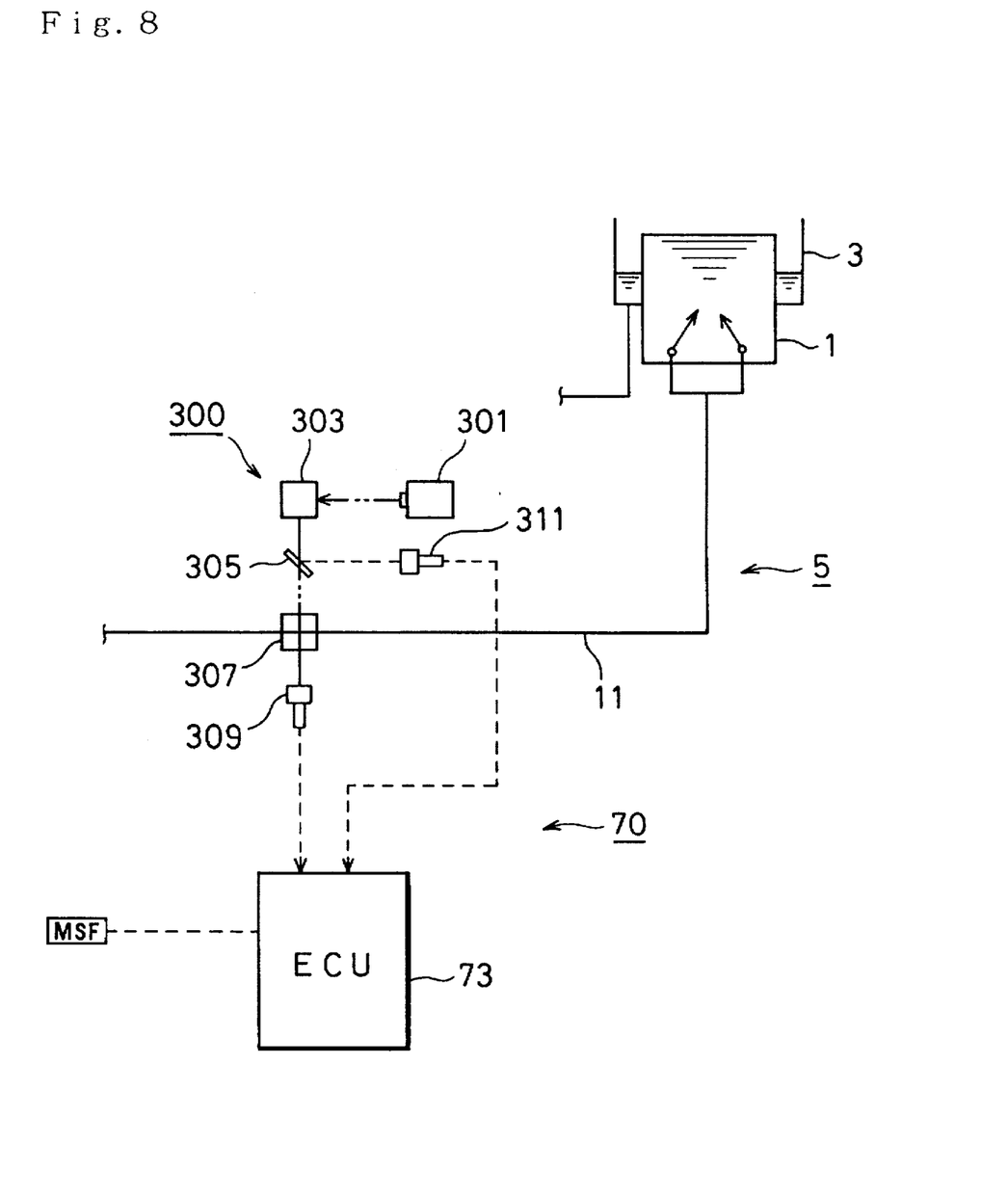
FIG. 8 schematically shows elements surrounding a chemical concentration sensor 300 of a third embodiment.

A substrate cleaning apparatus having a chemical agent producing device of the third embodiment has a structure identical with that of the first embodiment except for the chemical concentration sensor. In the third embodiment, the same elements as those of the first embodiment have the same numerals. Whereas the chemical concentration sensor 71 of the first embodiment has a structure for measuring pH as previously described, a chemical concentration sensor 300 of the third embodiment applies a principle of light absorption. FIG. 8 schematically shows elements surrounding the chemical concentration sensor 300 of the third embodiment.

Referring to FIG. 8, the chemical concentration sensor 300 includes a light source 301, a monochromator 303 for separating a light beam emitted from the light source 301 into monochromatic light beams each having a specific narrow wavelength band, a semi-transparent mirror 305, a quartz cell 307, a first light receiving element 309, and a second light receiving element 311 disposed in a direction of reflection from the semi-transparent mirror 305. The semi-transparent mirror 305, the quartz cell 307, and the first light receiving element 309 are arranged in a direction of irradiation of the monochromator 303. The quartz cell 307 is disposed in the middle of the pipe conduit 11. The first light receiving element 309 and the second light receiving element 311 respectively output detection signals according to the intensity of incident light beams.

In the chemical concentration sensor 300 the monochromator 303 separates a light beam emitted from the light source 301 into monochromatic light beams. Part of the monochromatic light beams are reflected from the semi-transparent mirror 305 and sent to the second light receiving element 311. The rest of the monochromatic light beams transmitted through the semi-transparent mirror 305 pass through the quartz cell 307 to the first light receiving element 309.

Detection signals output from the first light receiving element 309 and the second light receiving element 311 are input into the ECU 73, which compares the detection signal of the first light receiving element 309 with the detection signal of the second light receiving element 311 that is set at a reference luminous intensity and determines an absorbance at the quartz cell 307. The absorbance is correlated to the concentration of hydrogen chloride in the liquid chemical agent flowing through the pipe conduit 11 of the circulation system 5. The ECU 73 thereby determines the concentration of the liquid chemical agent circulating through the circulation system 5 according to the absorbance. The third embodiment having such a structure provides the same effects as the first embodiment.

A fourth embodiment according to the invention is described below.

Figure 9:
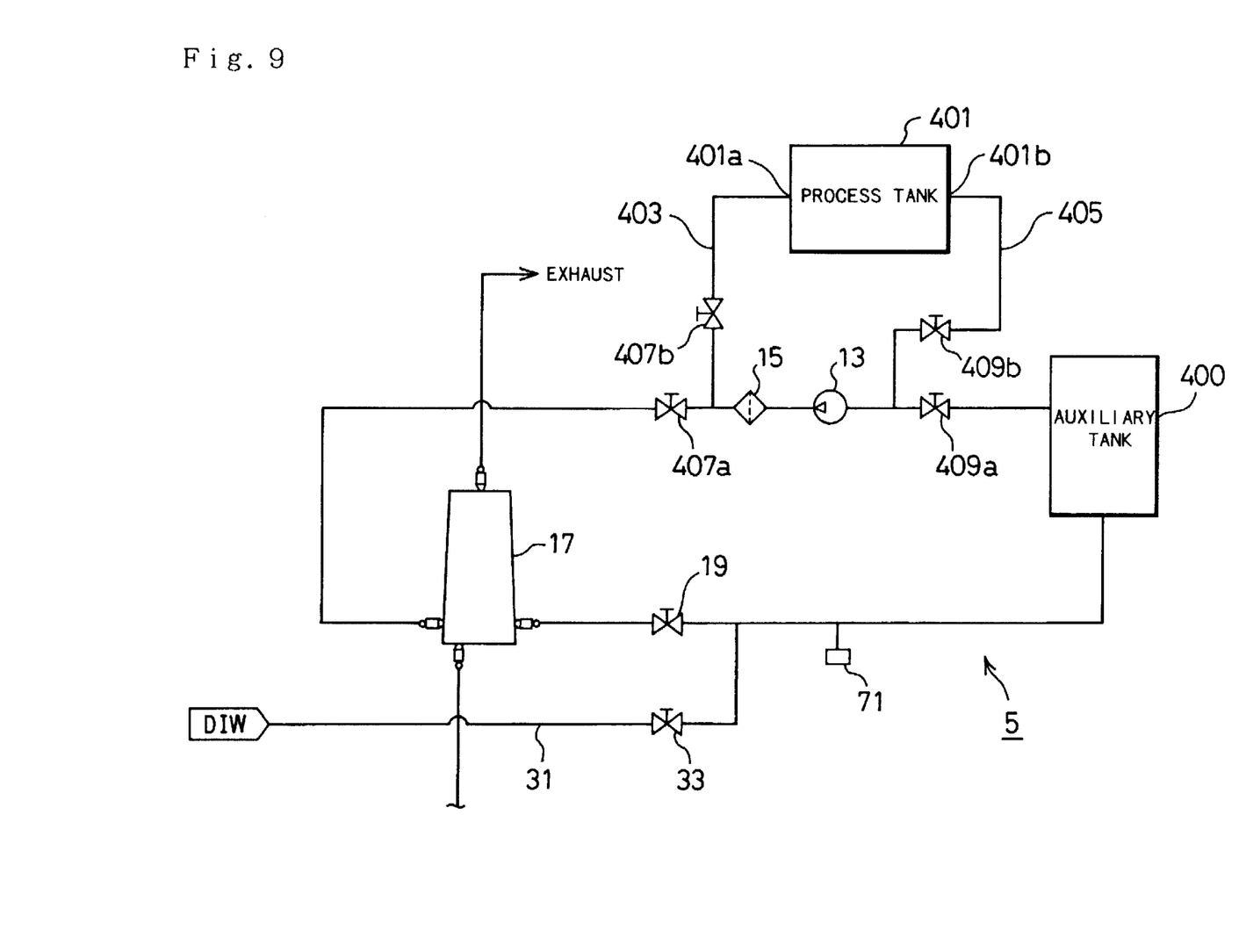
FIG. 9 schematically shows part of a fourth embodiment.

While the substrate cleaning apparatus having the chemical agent producing device of the first embodiment has the process tank 1 in the circulation system 5, the fourth embodiment shown in FIG. 9 includes an auxiliary tank 400 in the circulation system 5 which allows a liquid chemical agent to flow into a process tank 401 according to the requirements. The auxiliary tank 400 is placed at the specific position where the process tank 1 and the overflow tank 3 are disposed in the first embodiment. Branch pipes 403 and 405 that respectively connect an inlet 401a and an outlet 401b of the process tank 401 are arranged before and after the pump 13. A liquid chemical agent stored in the auxiliary tank 400 is fed into the process tank 401 by opening and closing the two pairs of opening/closing valves 407a, 407b, 409a, and 409b.

The structure of the fourth embodiment provides a liquid chemical agent having the desired high purity as in the first embodiment for feeding into the process tank 401 via the auxiliary tank 400. This results in high-quality cleaning of the substrates as in the first embodiment.

A fifth embodiment according to the invention is described below.

Figure 10:
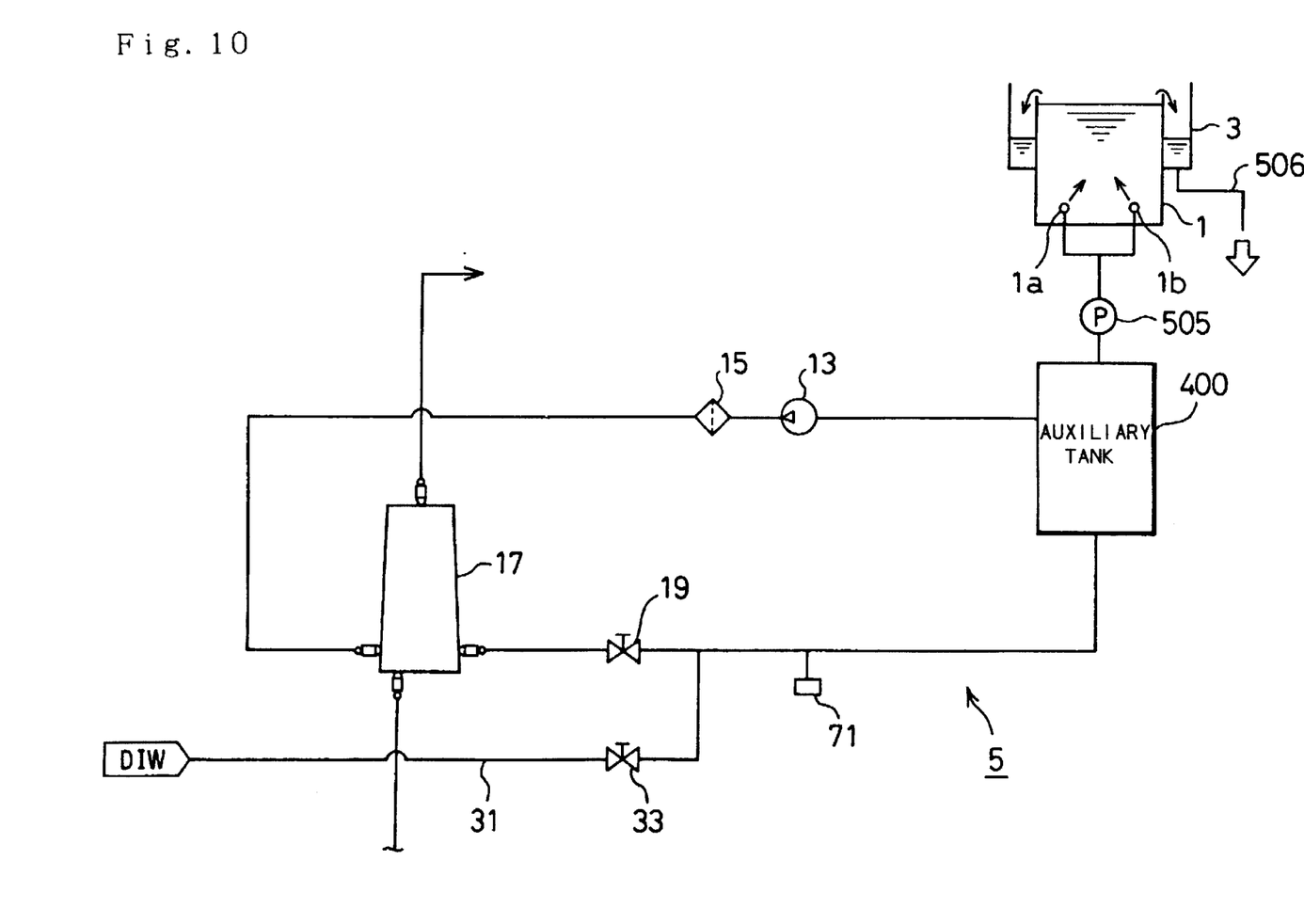
FIG. 10 schematically shows part of a fifth embodiment.

In the fifth embodiment shown in FIG. 10, the auxiliary tank 400 used in the fourth embodiment shown in FIG. 9 is connected to the process tank 1 whereas the overflow tank 3 is connected to a drainage system (not shown).

In this embodiment, a liquid chemical agent stored in the auxiliary tank 400 is fed into the process tank for cleaning substrates by controlling a pump 505. The liquid chemical agent overflowing from the process tank 1 to the overflow tank 3 flows in a pipe 506 to the drainage system.

The fifth embodiment may include a plurality of auxiliary tanks 400, circulation systems 5, gas supply systems 9, and the other required elements that are shown in FIG. 1. In such a case, different gases are fed into the plurality of gas supply systems 9, and different liquid chemical agents are accordingly stored in the plurality of auxiliary tanks 400. These liquid chemical agents are successively fed into the process tank 1 to execute a plurality of processes for the substrates that are held in the process tank 1.

A sixth embodiment according to the invention is described below.

In the above embodiments, the chemical agent producing device of the invention is applied to substrate processing apparatuses having an overflow-type process tank. In the sixth embodiment shown in FIG. 11, however, the chemical agent producing device of the invention is applied to a substrate processing apparatus 600 where a liquid chemical agent is sprayed from a nozzle 604 onto a substrate 603 held by the force of a suction onto a spin chuck 602 rotating in a process chamber 601.

Figure 11:
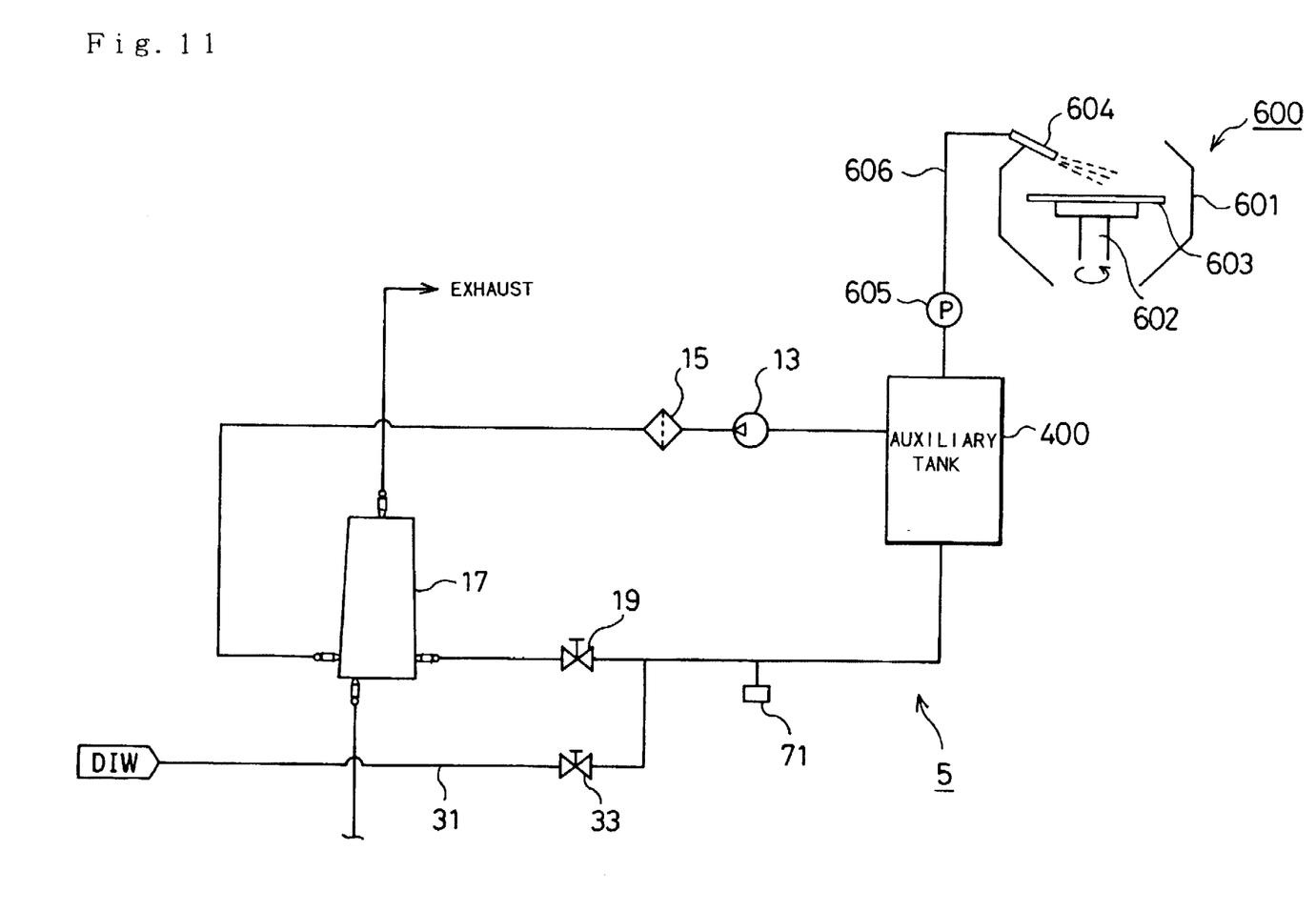
FIG. 11 schematically shows part of a sixth embodiment.

In this embodiment, the auxiliary tank 400 of the second embodiment and the process chamber 601 are connected with each other via a pipe conduit 606 with a pump 605. The pump 605 is controlled to spray the liquid chemical agent from the nozzle 604 onto the surface of the substrate 603 for processing the substrate 603.

The invention may have another structure which omits execution of the chemical concentration control by the chemical concentration sensor 71 and the ECU 73 but determines the concentration of hydrogen chloride in the liquid chemical agent only according to the amount of the gas that is fed from the first gas conduit 41. A gas other than hydrogen chloride, for example, ammonia gas, hydrogen fluoride, or ozone, may be supplied through the first gas conduit 41 to synthesize a liquid chemical agent other than hydrochloric acid, for example, ammonia water, hydrofluoric acid, aqueous ozone.

There may be many other modifications, alterations, and changes without departing from the scope or spirit of essential characteristics of the invention. It is thus clearly understood that the above embodiments are only illustrative and not restrictive in any sense. The scope and spirit of the present invention are limited only by the terms of the appended claims.

What is claimed is:

1. A device for producing a liquid chemical agent used for treating a substrate for a semiconductor device, said device comprising:

a container for treating said substrate with said liquid chemical agent, said container having an inlet and an outlet;

a circulation system connecting said inlet and said outlet of said container, and having a circulation pump;

a liquid water reservoir connected to said system;

a gas supply; and a gas-liquid mixer for synthesizing said liquid chemical agent, said mixer having an inlet connected to said gas supply, and an outlet for said liquid chemical agent connected to said circulation system.

2. A device in accordance with claim 1, further comprising a filter disposed in the connection of said mixer with said gas supply.

3. A device in accordance with claim 2, further comprising:

chemical concentration detection means disposed in said circulation system; and means for regulating the mixing ratio of said gas to said liquid connected to said chemical concentration detection means and said mixer.

4. A device in accordance with claim 3, wherein said chemical concentration detection means comprises a pH sensor.

5. A device in accordance with claim 3, wherein said chemical concentration detection means comprises:

a light source arranged to emit a light beam through said liquid chemical agent;

means for detecting the intensity of said light beam passing through said liquid chemical agent; and means for correlating the intensity of said light beam detected with the concentration of a specific chemical in said liquid chemical agent.

6. A device in accordance with claim 1, wherein said mixer further comprises a plurality of packings disposed therein for dispersing said gas in said liquid.

7. A device in accordance with claim 1, wherein said mixer further comprises:

a hollow drum having an inlet and an outlet for said gas; and a nozzle disposed in said drum and comprising a conduit having a plurality of apertures for spraying said liquid into said drum; and said outlet for said liquid chemical agent being disposed on a lower part of said drum.

8. A device in accordance with claim 1, wherein said circulation system further comprises:

an overflow container surrounding said container for receiving said liquid chemical agent that overflows from said container; and a conduit connecting said overflow container to said container.

9. A device for producing a liquid chemical agent used for treating a substrate for a semiconductor device, said device comprising:

a treatment container adapted to treat said substrate with said liquid chemical agent, said container having an inlet and an outlet;

a liquid chemical storage container having an inlet and an outlet, and connected to said treatment container;

a circulation system connecting said inlet and said outlet of said storage container, and having a circulation pump;

a liquid water reservoir connected to said system;

a gas supply; and a gas-liquid mixer for synthesizing said liquid chemical agent, said mixer having an inlet connected to said gas supply, and having an outlet for said liquid chemical agent connected to said circulation system.

10. A device in accordance with claim 9, wherein an overflow container surrounds said treatment container and receives said liquid chemical agent that overflows from said treatment container; and a conduit for discharging said liquid chemical agent received by said overflow container.

11. A device in accordance with claim 9, wherein said treatment container comprises:

a rotatable substrate holder and includes a liquid chemical agent sprayer, said sprayer connected to storage container.

12. A method of processing a liquid chemical agent for use in a unit adapted for treating a substrate for a semiconductor device, said method comprising the steps of:

(a) supplying liquid water to a circulation system;

(b) mixing a gas with a quantity of spent liquid chemical liquid reagent to synthesize said liquid chemical agent; and (c) supplying said liquid chemical agent to a circulation system for said unit for treating a substrate for a semiconductor device, said circulation system connecting an inlet and an outlet of said unit.

13. A method in accordance with claim 12, further comprising the step of removing fine particles included in said gas before step (b).

14. A method in accordance with claim 13, further comprising the steps of:

(d) detecting the concentration of a specific chemical in said liquid chemical agent; and (e) adjusting the mixing ratio of said gas to said liquid in step (b) based on the concentration detected in step (d) to control the concentration of said specific chemical in said liquid chemical agent to a desired value.

15. A method in accordance with claim 12, wherein step (b) further comprises the step of:

(b-1) dispersing said gas in said liquid.

16. A method in accordance with claim 12, wherein step (b) further comprises the steps of:

(b-2) storing said gas in a container;

(b-3) spraying said liquid from a plurality of apertures in a nozzle into said gas container; and (b-4) conveying said liquid chemical agent synthesized in step (b-3) to the outside of the gas container.

17. A method of processing a liquid chemical agent for use in a unit for treating a substrate for a semiconductor device, said method comprising the steps of:

(a) supplying liquid water to a circulation conduit;

(b) mixing a gas with spent liquid chemical agent to synthesize said liquid chemical agent;

(c) storing said liquid chemical agent in a auxiliary tank; and (d) feeding said liquid chemical agent to a circulation system for said unit for treating a substrate for a semiconductor device, said circulation system connecting an inlet and an outlet of said unit.

* * * * *